(12) United States Patent
Park et al.

(10) Patent No.: US 10,032,809 B2
(45) Date of Patent: Jul. 24, 2018

(54) METHOD OF MANUFACTURING DISPLAY DEVICE INCLUDING LIGHT BLOCKING PORTION ON PLANARIZATION LAYER PROTRUSION

(71) Applicant: Samsung Display Co., Ltd., Yongin-si, Gyeonggi-do (KR)

(72) Inventors: Jeongmin Park, Seoul (KR); Junhong Park, Suwon-si (KR); Yangho Jung, Seoul (KR); Jihyun Kim, Suwon-si (KR); Kyoungheon Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/255,005

(22) Filed: Sep. 1, 2016

(65) Prior Publication Data
US 2017/0133413 A1    May 11, 2017

(30) Foreign Application Priority Data
Nov. 9, 2015    (KR) .................. 10-2015-0156439

(51) Int. Cl.
*H01L 27/14*    (2006.01)
*H01L 27/12*    (2006.01)
(Continued)

(52) U.S. Cl.
CPC ........ *H01L 27/1288* (2013.01); *G02F 1/1368* (2013.01); *G02F 1/133512* (2013.01); *G02F 1/133514* (2013.01); *H01L 27/1248* (2013.01);
*G02F 1/13394* (2013.01); *G02F 1/133723* (2013.01); *G02F 1/134309* (2013.01); *G02F 1/136286* (2013.01);
(Continued)

(58) Field of Classification Search
CPC ............. H01L 27/1288; H01L 27/1248; G02F 1/133512; G02F 1/133514; G02F 1/1368
See application file for complete search history.

(56) References Cited

U.S. PATENT DOCUMENTS 7,212,262 B2    5/2007   Kang
9,207,499 B2    12/2015  Kwon et al.
(Continued)

FOREIGN PATENT DOCUMENTS

KR    10-2005-0064370 A    6/2005
KR    10-2007-0076842 A    7/2007
(Continued)

*Primary Examiner* — Matthew Gordon
(74) *Attorney, Agent, or Firm* — Innovation Counsel LLP

(57) ABSTRACT

A display device comprising a first substrate and a second substrate opposing one another, a thin film transistor and a color filter disposed on the first substrate, a planarization layer disposed on the thin film transistor and the color filter and a light blocking portion disposed on the planarization layer, the light blocking portion defining a pixel area, wherein the planarization layer comprises a first protrusion and a second protrusion, wherein the first protrusion is disposed in an area in which the light blocking portion is disposed, wherein the second protrusion is spaced apart from the first second protrusion, and wherein the light blocking portion comprises a first light blocking pattern disposed on the first protrusion, and the first light blocking pattern contacts the second substrate.

8 Claims, 5 Drawing Sheets

(51) Int. Cl.
  *G02F 1/1368* (2006.01)
  *G02F 1/1335* (2006.01)
  *G02F 1/1333* (2006.01)
  *G02F 1/1337* (2006.01)
  *G02F 1/1343* (2006.01)
  *G02F 1/1362* (2006.01)
  *G02F 1/1339* (2006.01)

(52) U.S. Cl.
  CPC ............ *G02F 2001/133357* (2013.01); *G02F 2001/133742* (2013.01); *G02F 2001/136222* (2013.01); *G02F 2001/136231* (2013.01); *G02F 2201/121* (2013.01); *G02F 2201/123* (2013.01)

(56) References Cited

U.S. PATENT DOCUMENTS

2007/0291217 A1* 12/2007 Kang ................ G02F 1/136227
   349/156
2012/0038867 A1* 2/2012 Kwon ............... G02F 1/133512
   349/110

FOREIGN PATENT DOCUMENTS

| KR | 10-2012-0014749 A | 2/2012 |
| KR | 10-2013-0013110 A | 2/2013 |

* cited by examiner

METHOD OF MANUFACTURING DISPLAY DEVICE INCLUDING LIGHT BLOCKING PORTION ON PLANARIZATION LAYER PROTRUSION

CROSS-REFERENCE TO RELATED APPLICATION

This application claims the priority to and all the benefits accruing under 35 U.S.C. § 119 of Korean Patent Application No. 10-2015-0156439, filed on Nov. 9, 2015, with the Korean Intellectual Property Office (KIPO), the disclosure of which is incorporated herein in its entirety by reference.

BACKGROUND

1. Field

Embodiments of the present inventive concept relate to a display device, and more particularly, to a display device which reduces the number of mask tones and a method of manufacturing the display device.

2. Description of the Related Art

Display devices are classified into several types including liquid crystal display ("LCD") devices, organic light emitting diode ("OLED") display devices, plasma display panel ("PDP") devices, electrophoretic display ("EPD") devices, and the like, based on a light emitting scheme thereof.

Among these, an LCD device generally includes two opposing display substrates, an electrode disposed on at least one of the two display substrates, and a liquid crystal layer interposed between the two display substrates.

In general, an LCD device has a structure in which one of the two display substrates includes a plurality of thin film transistors and a pixel electrode disposed thereon and the other display substrate includes a plurality of color filters, a light blocking portion, and a common electrode disposed thereon. In recent times, however, a color filter on array ("COA") structure in which a color filter, a light blocking portion, a pixel electrode, and the like, are disposed on the same substrate, separately from the common electrode, has been developed.

In addition, to simplify a manufacturing process of a display device, a black column spacer ("BCS") structure in which a column spacer and a light blocking layer are formed using the same material through the same process has been suggested. The column spacer may be disposed to maintain a uniform cell gap, which is a distance between two substrates.

It is to be understood that this background of the technology section is intended to provide useful background for understanding the technology and as such disclosed herein, the technology background section may include ideas, concepts or recognitions that are not part of what was known or appreciated by those skilled in the pertinent art prior to a corresponding effective filing date of subject matter disclosed herein.

SUMMARY

Aspects of embodiments of the present inventive concept are directed to a display device which reduces the number of mask tones, thereby reducing manufacturing costs, and a method of manufacturing the display device.

According to an exemplary embodiment of the present inventive concept, A display device comprising: a first substrate and a second substrate opposing one another; a thin film transistor and a color filter disposed on the first substrate; a planarization layer disposed on the thin film transistor and the color filter; and a light blocking portion disposed on the planarization layer, the light blocking portion defining a pixel area, wherein the planarization layer comprises a first protrusion and a second protrusion, wherein the first protrusion is disposed in an area in which the light blocking portion is disposed, wherein the second protrusion is spaced apart from the first second protrusion, and wherein the light blocking portion comprises a first light blocking pattern disposed on the first protrusion, and the first light blocking pattern contacts the second substrate.

The first protrusion and the first light blocking pattern may directly contact one another.

The first protrusion and the second protrusion have a same height as one another measured from the planarization layer.

A height of the first protrusion is greater than a height of the second protrusion measured from the planarization layer.

The light blocking portion further comprises a second light blocking pattern disposed on the second protrusion.

An overall combined height of the first protrusion and the first light blocking pattern is greater than an overall combined height of the second protrusion and the second light blocking pattern.

The second protrusion and the second light blocking pattern directly contact one another.

The second light blocking pattern and the first light blocking pattern have a same height.

A height of the second light blocking pattern is less than a height of the first light blocking pattern.

According to another exemplary embodiment of the present inventive concept, a method of manufacturing a display device, the method includes: providing a first substrate; disposing a thin film transistor and a color filter on the first substrate; disposing a planarization layer on the thin film transistor and the color filter, the planarization layer including a first protrusion and a second protrusion; disposing a light blocking portion on the planarization layer to define a pixel area; disposing a liquid crystal layer on the first substrate; and disposing a second substrate opposite to and spaced apart from the first substrate, wherein the light blocking portion includes a first light blocking pattern disposed on the first protrusion, and the first light blocking pattern contacts the second substrate.

The first protrusion and the second protrusion of the planarization layer have a same height as one another measured from the planarization layer.

the disposing of the planarization layer comprises: disposing a first photosensitive composition on the thin film transistor; disposing a first exposure mask over the first photosensitive composition, and performing exposure by irradiating light to the first photosensitive composition; and developing and curing the exposed first photosensitive composition.

The first exposure mask comprises a light-transmissive pattern, a semi-transmissive pattern, and a light blocking pattern.

The planarization layer is formed of a negative photosensitive composition, and wherein the light-transmissive pattern corresponds to a region for the first protrusion and the second protrusion, and the light blocking pattern corresponds to a region for a contact hole.

The disposing of the light blocking portion comprises: disposing a second photosensitive composition on the planarization layer; disposing a second exposure mask over the second photosensitive composition, and performing exposure by irradiating light to the second photosensitive composition; and developing and curing the exposed second photosensitive composition.

The second exposure mask comprises a light-transmissive pattern, a semi-transmissive pattern, and a light blocking pattern.

A height of the second protrusion is less than a height of the first protrusion measured from the planarization layer.

The light blocking portion further comprising a second light blocking pattern disposed on the second protrusion.

The second light blocking pattern and the light blocking portion are formed by a same process.

The foregoing is illustrative only and is not intended to be in any way limiting.

In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present inventive concept will be more clearly understood from the following detailed description taken in conjunction with the accompanying drawings, in which.

DETAILED DESCRIPTION

Figure 1:
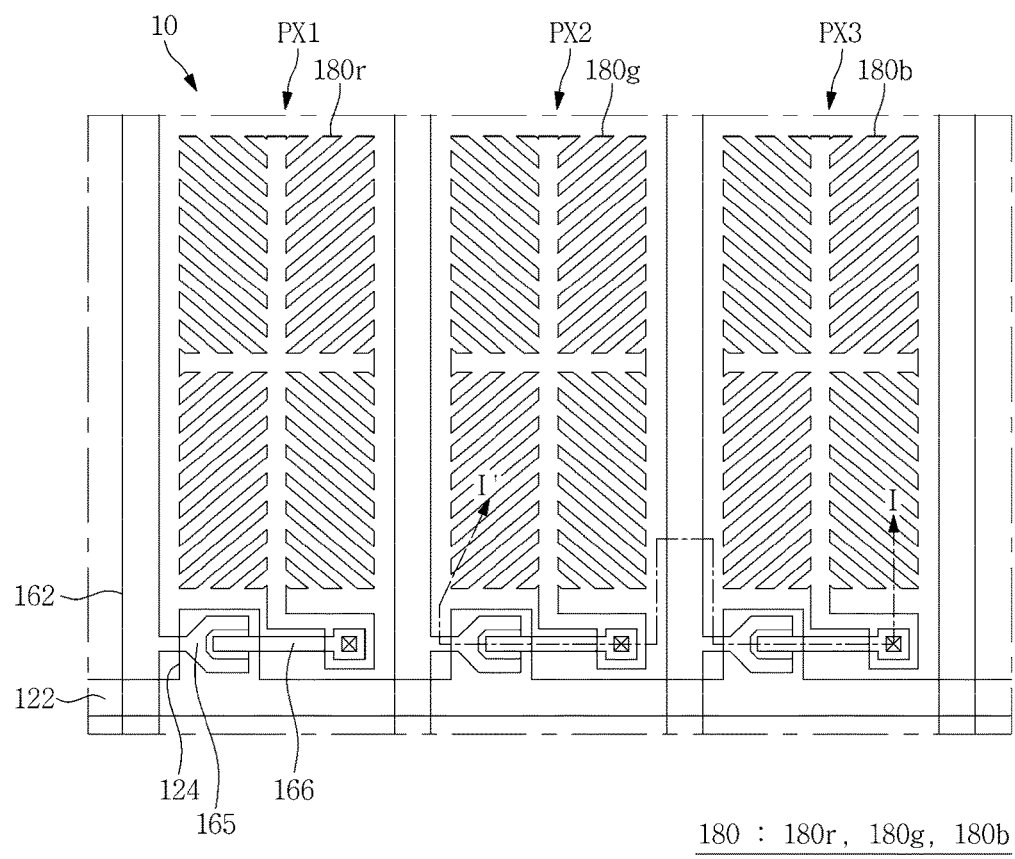
FIG. 1 is a plan view illustrating an exemplary embodiment of a display device.

Advantages and features of the present inventive concept and methods for achieving them will be made clear from embodiments described below in detail with reference to the accompanying drawings. The present inventive concept may, however, be embodied in many different forms and should not be construed as being limited to the embodiments set forth herein. Rather, these embodiments are provided so that this disclosure will be thorough and complete, and will fully convey the scope of the present inventive concept to those skilled in the art. The present inventive concept is merely defined by the scope of the claims. Therefore, well-known constituent elements, operations and techniques are not described in detail in the embodiments in order to prevent the present inventive concept from being obscurely interpreted. Like reference numerals refer to like elements throughout the specification.

In the drawings, thicknesses of a plurality of layers and areas may be illustrated in an enlarged manner for clarity and ease of description thereof. When a layer, an area, or a plate is referred to as being "on" another layer, area, or plate, it may be directly on the other layer, area, or plate, or one or more intervening layers, areas, or plates may be present therebetween. Conversely, when a layer, an area, or a plate is referred to as being "directly on" another layer, area, or plate, intervening layers, areas, or plates may be absent therebetween. Further when a layer, an area, or a plate is referred to as being "below" another layer, area, or plate, it may be directly below the other layer, area, or plate, or one or more intervening layers, areas, or plates may be present therebetween. Conversely, when a layer, an area, or a plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It will be understood that the spatially relative terms are intended to encompass different orientations of a device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in another direction, and thus the spatially relative terms may be interpreted differently depending on the orientations.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined herein.

Hereinafter, exemplary embodiments of a display device according to the present inventive concept will be explained with respect to a liquid crystal display ("LCD") device. However, the display device is not limited thereto, and features of the present inventive concept may also be applied to an organic light emitting diode ("OLED") display device.

In exemplary embodiments, the display device has a color filter on array ("COA") structure in which a thin film transistor and a color filter are disposed on the same substrate, but not being limited thereto.

Figure 2:
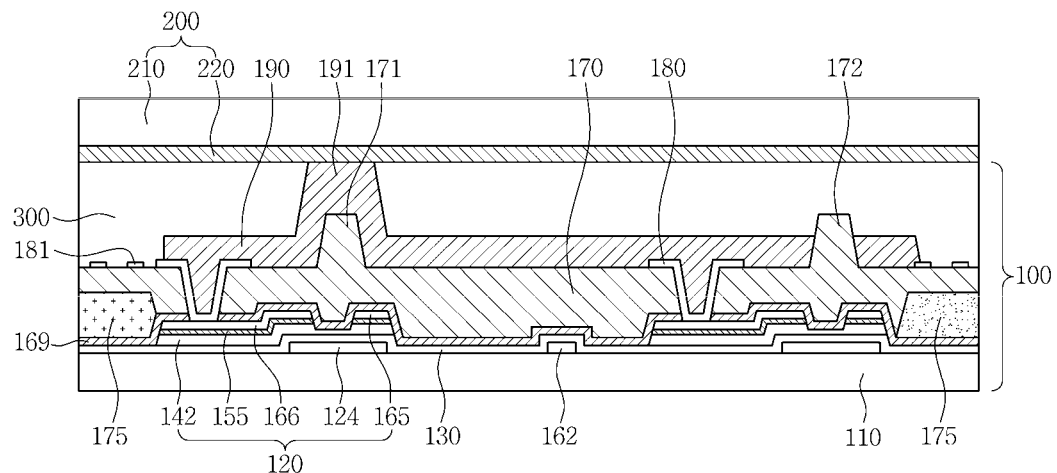
FIG. 2 is a cross-sectional view taken along line I-I' of FIG. 1 according to an exemplary embodiment.

FIG. 1 is a plan view illustrating an exemplary embodiment of a display device 10. FIG. 2 is a cross-sectional view taken along line of FIG. 1 according to an exemplary embodiment.

Referring to FIGS. 1 and 2, the display device 10 includes a first panel 100 and a second panel 200 opposing one another, and a liquid crystal layer 300 disposed between the first and second panels 100 and 200.

Hereinafter, the first panel 100 will be described.

The first panel 100, as illustrated in FIGS. 1 and 2, includes a first substrate 110, gate wirings 122 and 124, a gate insulating layer 130, a semiconductor layer 142, an ohmic contact layer 155, a source electrode 165, a drain electrode 166, a data line 162, a passivation layer 169, a color filter 175, a planarization layer 170, a pixel electrode 180, and a light blocking portion 190.

The first substrate 110 may be an insulating substrate including a transparent material such as glass (e.g., soda-lime glass or borosilicate glass) or plastic.

The display device 10 includes a plurality of pixel areas PX1, PX2, and PX3 disposed on the first substrate 110. The plurality of pixel areas PX1, PX2, and PX3 include red, green, and blue pixels arranged substantially in a matrix form.

In an exemplary embodiment, for example, only a configuration of the pixel area PX1 will be described, for convenience of description.

As illustrated in FIG. 1, the gate wirings 122 and 124 are disposed on the first substrate 110 to transmit a gate signal. The gate wirings 122 and 124 include a gate line 122 extending in a direction, for example, a transverse direction, and a gate electrode 124 defined by a protruding portion of the gate line 122 to form a protrusion shape. The gate electrode 124, along with the source electrode 165 and the drain electrode 166, which are described below in greater detail, may collectively define a three-terminal structure of a thin film transistor 120.

Although not illustrated, a storage wiring may further be disposed on the first substrate 110 to define a storage capacitor, along with the pixel electrode 180. For example, the storage wiring may be provided simultaneously with the gate wirings 122 and 124. In such an example, the storage wiring may be disposed on the same layer as the layer on which the gate wirings 122 and 124 are disposed, and may include the same material as that included in the gate wirings 122 and 124.

In an exemplary embodiment, the gate wirings 122 and 124 may include an aluminum (Al)-based metal, e.g., Al or an Al alloy, a silver (Ag)-based metal, e.g., Ag or a Ag alloy, a copper (Cu)-based metal, e.g., Cu or a Cu alloy, a molybdenum (Mo)-based metal, e.g., Mo or a Mo alloy, chromium (Cr), titanium (Ti), tantalum (Ta), and/or the like.

In an exemplary embodiment, the gate wirings 122 and 124 may have a multilayer structure including two conductive layers (not illustrated) having different physical properties from one another.

One of the two conductive layers may include a metal, e.g., an Al-based metal, an Ag-based metal, or a Cu-based metal, which has relatively low resistivity, to reduce a signal delay or a voltage drop of the gate wirings 122 and 124.

The other of the two conductive layers may include a material, e.g., a Mo-based metal, Cr, Ti, or Ta, which has a relatively high contact property with another material, e.g., indium-tin oxide ("ITO") and indium-zinc oxide ("IZO").

In an exemplary embodiment, for example, the two conductive layers of the multilayer structure may include a Cr lower layer and an Al upper layer, an Al lower layer and a Mo upper layer, and a Ti lower layer and a Cu upper layer. However, the material included in the gate wirings 122 and 124 is not limited thereto, and the gate wirings 122 and 124 may include any suitable metal and conductor.

The gate insulating layer 130 is disposed on the first substrate 110 and the gate wirings 122 and 124. In an exemplary embodiment, the gate insulating layer 130 may include silicon oxide ($SiO_x$) or silicon nitride ($SiN_x$), for example. In an exemplary embodiment, the gate insulating layer 130 may include aluminum oxide, titanium oxide, tantalum oxide, or zirconium oxide, for example.

The semiconductor layer 142 is disposed on the gate insulating layer 130 to form a channel of the thin film transistor 120. The semiconductor layer 142 overlaps at least a portion of the gate electrode 124. In an exemplary embodiment, the semiconductor layer 142 may include amorphous silicon (also referred to as "a-Si"), or an oxide semiconductor including at least one of gallium (Ga), indium (In), tin (Sn), and zinc (Zn).

The ohmic contact layer 155 is disposed on the semiconductor layer 142. The ohmic contact layer 155 may increase a contact property between the source electrode 165 and/or the drain electrode 166 and the semiconductor layer 142.

In an exemplary embodiment, the ohmic contact layer 155 may include amorphous silicon doped with n-type impurities at high concentration (also referred to as "n+a–Si"). In an exemplary embodiment in which the contact property between the source electrode 165 and/or the drain electrode 166 and the semiconductor layer 142 is sufficiently secured, the ohmic contact layer 155 may be omitted.

Data wirings 162, 165, and 166 are disposed on the ohmic contact layer 155 and the gate insulating layer 130. The data wirings 162, 165, and 166 include the data line 162, the source electrode 165, and the drain electrode 166. The data line 162 extends in a direction, for example, a longitudinal direction, intersecting the gate line 122 to define, along with the gate line 122, the pixel area. The source electrode 165 branches out from the data line 162 to extend onto the semiconductor layer 142. The drain electrode 166 is spaced apart from the source electrode 165, and is disposed on the semiconductor layer 142 to be opposite to the source electrode 165 with respect to the gate electrode 124 or the channel of the thin film transistor 120. In an exemplary embodiment, the drain electrode 166 may extend from an upper portion of the semiconductor layer 142 to a lower portion of the pixel electrode 180.

The passivation layer 169 is disposed over substantially the entire surface of a structure which includes the data wirings 162, 165, and 166. In an exemplary embodiment, the passivation layer 169 may have a monolayer structure or a multilayer structure including, for example, silicon oxide, silicon nitride, a photosensitive organic material, or a low dielectric constant (low-k) insulating material, e.g., a-Si:C:O or a-Si:O:F.

The structure of the thin film transistor 120 described hereinabove with reference to FIGS. 1 and 2 is only given by way of example, and may be modified in any suitable manner. In an exemplary embodiment, the structure of the thin film transistor 120 is described as a bottom-gate structure. However, the structure of the thin film transistor 120 is not limited thereto, and may include a top-gate structure.

The plurality of color filters 175 including red, green, and blue color filters are disposed on the passivation layer 169.

In an exemplary embodiment, the color filters 175 may be disposed in corresponding ones of the pixel areas PX1, PX2, and PX3, respectively, in an island-shaped manner. In such an exemplary embodiment, the plurality of color filters 175 may be spaced apart from one another in a transverse or longitudinal direction. In an alternative exemplary embodiment, adjacent edges of adjacent ones of the color filters 175 may overlap one another.

In an exemplary embodiment, the pixel area is described as including a red pixel area PX1, a green pixel area PX2, and a blue pixel area PX3, for example. However, the pixel area is not limited thereto, and may include four or more pixel areas which further include a white pixel area, for example.

In an exemplary embodiment, the color filter 175 may be disposed in the second panel 200 rather than in the first panel 100. In such an exemplary embodiment, the color filter 175 is disposed in each corresponding one of the pixel areas PX1, PX2, and PX3 of a second substrate 210.

The planarization layer 170 may be disposed on the plurality of color filters 175. In an exemplary embodiment, the planarization layer 170 may have a monolayer structure or a multilayer structure including, for example, silicon oxide, silicon nitride, a photosensitive organic material, or a low dielectric constant (low-k) insulating material, e.g., a-Si:C:O or a-Si:O:F. In an exemplary embodiment, the planarization layer 170 may have a thickness in a range of about 1.0 micrometer (μm) to about 2.5 μm.

In an exemplary embodiment, the planarization layer 170 may include a negative photosensitive composition of which an exposed portion remains and a non-exposed portion is developed. In an alternative exemplary embodiment, the planarization layer 170 may include a positive photosensitive composition. In an exemplary embodiment, the planarization layer 170 may include a photosensitive organic material. In such an exemplary embodiment in which the planarization layer 170 includes a photosensitive organic material, the planarization layer 170 may be referred to as an organic layer.

Referring to FIG. 2, the planarization layer 170 includes a first protrusion 171 and a second protrusion 172 which are protruded toward the second substrate 210. The second protrusion 172 may be disposed on a pixel adjacent to a pixel in which the first protrusion 171 is disposed.

A contact hole through which a portion of the thin film transistor 120 is exposed may be defined through the planarization layer 170 and the passivation layer 169. For example, an end portion of the drain electrode 166, below the pixel electrode 180, may be exposed through the contact hole.

In an exemplary embodiment, the first protrusion 171 may be disposed on the gate line 122. In an alternative exemplary embodiment, the first protrusion 171 may be disposed on the data line 162 rather than on the gate line 122. However, the position of the first protrusion 171 is not limited thereto, and the first protrusion 171 may be disposed at any position in an area in which the light blocking portion 190 is to be disposed.

In an exemplary embodiment, the first protrusion 171 may protrude toward the second panel 200 to have a predetermined height, and may be formed using the same material through the same process as the planarization layer 170. In such an exemplary embodiment, the first protrusion 171 protrudes from the planarization layer 170.

As illustrated in FIG. 2, in an exemplary embodiment, each of a lower surface and an upper surface of the first protrusion 171 may have a circular shape in a plan view. In an alternative exemplary embodiment, each of a lower surface and an upper surface of the first protrusion 171 may have a polygonal shape in a plan view.

In an exemplary embodiment, the second protrusion 172 may be disposed on the gate line 122. In an alternative exemplary embodiment, the second protrusion 172 may be disposed on the data line 162 rather than on the gate line 122. However, the position of the second protrusion 172 is not limited thereto, and the second protrusion 172 may be disposed at any position in an area in which the light blocking portion 190 is to be disposed.

In an exemplary embodiment, the second protrusion 172 may protrude toward the second panel 200 to have a predetermined height, and may be formed using the same material through the same process as the planarization layer 170. In such an exemplary embodiment, the second protrusion 172 protrudes from the planarization layer 170.

In an exemplary embodiment, each of a lower surface and an upper surface of the second protrusion 172 may have a circular shape in a plan view. In an alternative exemplary embodiment, each of a lower surface and an upper surface of the second protrusion 172 may have a polygonal shape in a plan view.

In an exemplary embodiment, the second protrusion 172 and the first protrusion 171 may have substantially the same height measured from an upper surface of the planarization layer 170. In such an exemplary embodiment, the first protrusion 171 and the second protrusion 172 may be simultaneously provided by a photolithography process.

In an alternative exemplary embodiment, the height of the second protrusion 172 may be less than the height of the first protrusion 171 measured from the surface of the planarization layer 170.

In an exemplary embodiment, the second protrusion 172, not being in contact with the second panel 200, may serve as a sub-column spacer which maintains a substantially uniform cell gap of the liquid crystal layer 300 when applied with external impacts.

As used herein, a distance between the first substrate 110 and the second substrate 210 of the display device 10 may be referred to as a cell gap. Such a cell gap may affect the overall operational efficiency of the display device 10 in terms of, for example, response speed, a contrast ratio, a viewing angle, or luminance uniformity. Accordingly, a substantially uniform cell gap may be maintained throughout substantially the entire area between the first substrate 110 and the second substrate 210 in order to uniformly display an image over substantially the entire screen of the display device 10.

Referring to FIG. 2, in an exemplary embodiment, for example, a distance between the planarization layer 170 and the common electrode 220 may be defined as the cell gap. In general, the cell gap may be in a range of about 3 μm to about 4 μm, for example, in a range of about 3.2 μm to about 3.4 μm.

The pixel electrode 180 is disposed on the planarization layer 170 to be electrically connected to the drain electrode 166 through the contact hole. The pixel electrode 180 may include a transparent conductor, e.g., ITO or IZO. As previously described, the pixel electrode 180 is disposed in the pixel area, and may be connected to the thin film transistor 120 through the contact hole.

The pixel electrode 180 includes a cross-shaped stem portion and a plurality of branch portions 181 extending from the stem portion.

The light blocking portion 190 is disposed on the planarization layer 170 and the pixel electrode 180, and includes a first light blocking pattern 191 protruded toward the second substrate 210.

In an exemplary embodiment, the light blocking portion 190 may effectively prevent light from being emitted from an area other than the pixel area. In such an exemplary embodiment, the light blocking portion 190 may reduce or effectively prevent light leakage in a non-pixel area. To this end, apertures are defined in the light blocking portion 190 corresponding to the pixel areas PX1, PX2, and PX3, respectively, such that the light blocking portion 190 covers substantially the entire area that is left other than the pixel areas PX1, PX2, and PX3. The pixel areas PX1, PX2, and PX3 are defined by the light blocking portion 190. In an exemplary embodiment, for example, the light blocking portion 190 may have a dielectric constant in a range of about 3 to about 5.

Referring to FIG. 2, the light blocking portion 190 may include a horizontal portion and a vertical portion.

The horizontal portion extends along the gate line 122. In an exemplary embodiment, the horizontal portion overlaps the gate line 122, the thin film transistor 120, and the data line 162. In such an exemplary embodiment, the gate electrode 124, the source electrode 165, and the drain electrode 166 of the thin film transistor 120 overlap the horizontal portion.

The vertical portion is disposed between adjacent ones of the horizontal portions, and extends along the data line 162. The vertical portion overlaps the data line 162.

In an exemplary embodiment, the vertical portion of the light blocking portion 190 may contact the pixel electrode 180. In such an exemplary embodiment, the vertical portion may contact an upper surface of the pixel electrode 180. As used herein, the upper surface of the pixel electrode 180 refers to an upper surface of the branch portion 181. The upper surface of the branch portion 181 faces toward the liquid crystal layer 300.

However, the disposition of the light blocking portion 190 is not limited thereto, and the light blocking portion 190 may be disposed only on the gate line 122.

The first light blocking pattern 191 is disposed on the first protrusion 171 of the planarization layer 170, and protrudes from the light blocking portion 190. The first light blocking pattern 191 and the first protrusion 171 may directly contact and overlap one another.

Referring to FIG. 2, in an exemplary embodiment, the first light blocking pattern 191 may have a trapezoidal cross section taken along a thickness direction thereof. In an alternative exemplary embodiment, the first light blocking pattern 191 may have a polygonal cross section taken along the thickness direction thereof.

In an exemplary embodiment, the first light blocking pattern 191 contacts the second panel 200. In such an exemplary embodiment, an upper end of the first light blocking pattern 191 and the second substrate 210 contact one another, such that the first light blocking pattern 191 may serve as a main column spacer which maintains a substantially uniform cell gap between the first substrate 110 and the second substrate 210.

A thickness of the light blocking portion 190, a thickness of the first light blocking pattern 191, and the height of the second protrusion 172 may be different from one another within the range of the height of the cell gap.

In an exemplary embodiment, the second protrusion 172, not being in contact with the second panel 200, may serve as the sub-column spacer, which supports the function of the main column spacer, so that a substantially uniform cell gap of the liquid crystal layer 300 may be maintained when applied with external impacts.

As such, the main column spacer, e.g., the first light blocking pattern 191, and the sub-column spacer, e.g., the second protrusion 172, may maintain a substantially uniform cell gap between the first substrate 110 and the second substrate 210, thus enhancing the overall operating efficiency of the display device 10.

In an exemplary embodiment, the light blocking portion 190 and the first light blocking pattern 191 may be collectively provided as a unitary single unit by a photolithography process, using the same material. Such a simultaneously and collectively provided unitary structure of the light blocking portion 190 and the first light blocking pattern 191 is referred to as a black column spacer ("BCS") structure.

In an exemplary embodiment, the light blocking portion 190 and the first light blocking pattern 191 may be provided using a negative photosensitive composition of which a non-exposed portion is developed. In such an exemplary embodiment, the photosensitive composition used for providing the light blocking portion 190 may include a binder resin, a polymerizable monomer, a polymerizable oligomer, a pigment, a dispersant, and/or a photo-initiator. Examples of the pigment may include a black pigment, a black resin, or the like. Hereinafter, the photosensitive composition used for providing the light blocking portion 190 and the first light blocking pattern 191 is referred to as a "light blocking material."

Precision patterning may be performed so that the light blocking portion 190 and the first light blocking pattern 191 may have different thicknesses from one another in a range of about 3 μm to about 4 μm, for example, in a range of about 3.2 μm to about 3.4 μm.

For precision of patterning, for example, a light blocking material having a relatively high transmittance may be included in the light blocking portion 190 so that the light blocking material may have different degrees of light exposure based on the intensity of light. However, in such an example, the light blocking capability of the light blocking portion 190 may decrease.

Alternatively, for example, a light blocking material having a relatively low transmittance may be included in the light blocking portion 190. In such an example, the light blocking capability of the light blocking portion 190 may be enhanced. However, the light blocking material may not have different degrees of light exposure based on the intensity of light, thus leading to difficulty in precision of patterning.

In an exemplary embodiment, the light blocking portion 190 and the first light blocking pattern 191 include a light blocking material having a relatively high transmittance. Accordingly, in such an exemplary embodiment, precision patterning may be achieved.

In an exemplary embodiment, the light blocking portion 190 and the first light blocking pattern 191 may include a light blocking material having a relatively low optical density ("OD"). For example, such a light blocking material may include a photosensitive material that has an OD of less than or equal to about 2 with respect to an i-ray, which has a wavelength of about 365 nanometers (nm), when a thickness of the photosensitive material is about 1 μm.

The first protrusion 171 and the first light blocking pattern 191 may be disposed in a blue pixel.

Although not illustrated, a lower alignment layer may be disposed on the pixel electrode 180. In an exemplary embodiment, the lower alignment layer may be a homeotropic alignment layer, or may include a photosensitive material, for example.

In an exemplary embodiment, for example, the lower alignment layer may include one of polyamic acid, polysiloxane, and polyimide.

Hereinafter, the second panel 200 will be described.

The second panel 200 includes the second substrate 210 and the common electrode 220. The second substrate 210 may be an insulating substrate including a transparent material, e.g., glass or plastic. The common electrode 220 may include a transparent conductor, e.g., ITO or IZO.

Although not illustrated, the second panel 200 may further include an upper alignment layer. The upper alignment layer is disposed on the common electrode 220. In an exemplary embodiment, the upper alignment layer and the lower alignment layer may include the same material as one another.

When surfaces of the first substrate 110 and the second substrate 210 opposing one another are defined as upper surfaces, e.g., inner surfaces, of the corresponding substrates, respectively, and surfaces of the first substrate 110 and the second substrate 210 disposed opposite to the upper surfaces thereof are defined as lower surfaces, e.g., outer surfaces, of the corresponding substrates, respectively, an upper polarizer (not illustrated) may further be disposed on the lower surface of the first substrate 110 and a lower polarizer (not illustrated) may further be disposed on the lower surface of the second substrate 210.

The liquid crystal layer 300 is disposed between the first substrate 110 and the second substrate 210.

In an exemplary embodiment, the liquid crystal layer 300 may include nematic liquid crystal materials having positive dielectric anisotropy. In such an exemplary embodiment, liquid crystal molecules of the liquid crystal layer 300 may have a structure in which a major axis of the liquid crystal molecules is oriented substantially parallel to one of the first panel 100 and the second panel 200 and the major axis is twisted into a spiral shape at an angle of 90 degrees from a rubbing direction of the alignment layer of the first panel 100 to the second panel 200. In an alternative exemplary embodiment, the liquid crystal layer 300 may include homeotropic liquid crystal materials in lieu of the nematic liquid crystal materials. In an alternative exemplary embodiment, the liquid crystal layer 300 may include vertical alignment liquid crystal materials in lieu of the nematic liquid crystal materials in which liquid crystal is aligned vertically with respect to the first substrate 110 and the second substrate 210 when no voltage is applied to the liquid crystal.

Figure 3:
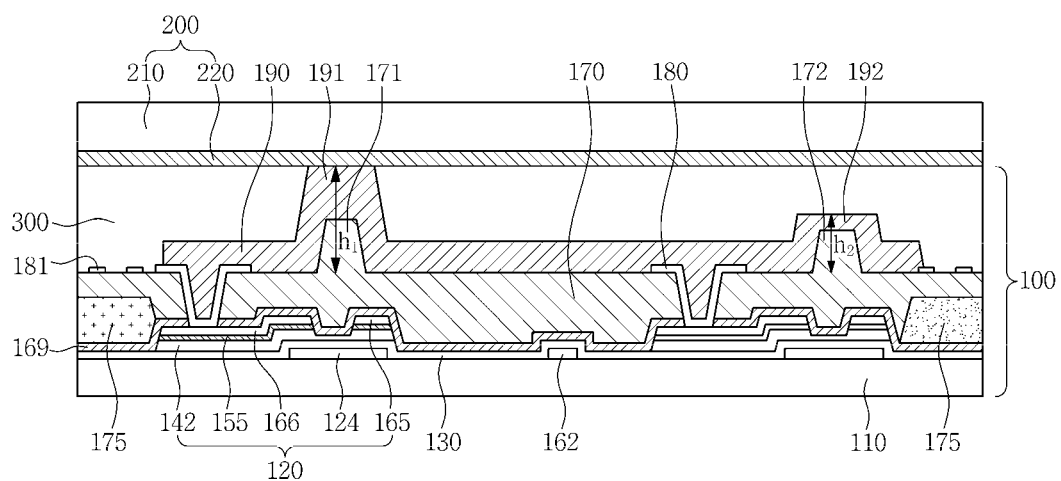
FIG. 3 is a cross-sectional view taken along line I-I' of FIG. 1 according to an alternative exemplary embodiment.

Hereinafter, an alternative exemplary embodiment of a display device 10 (refer to FIG. 1) will be described with reference to FIG. 3. FIG. 3 is a cross-sectional view taken along line I-I' of FIG. 1 according to an alternative exemplary embodiment. A repetitive description of the display device 10 which has been provided in the previous exemplary embodiment will be omitted herein for convenience of description.

Referring to FIG. 3, the display device 10 includes a first panel 100, a second panel 200 opposing the first panel 100, and a liquid crystal layer 300 between the first panel 100 and the second panel 200.

The first panel 100 includes a thin film transistor 120, a color filter 175, a planarization layer 170, a pixel electrode 180, a light blocking portion 190, and a first light blocking pattern 191.

The thin film transistor 120 includes a gate electrode 124, a gate insulating layer 130, a semiconductor layer 142, a source electrode 165, and a drain electrode 166.

The color filter 175 is disposed on a first substrate 110 on which the thin film transistor 120 is disposed, and adjacent edges of adjacent ones of the color filters 175 may overlap one another.

In an exemplary embodiment, the color filter 175 is described as including a three-color filter, for example, a red color filter, a green color filter and a blue color filter. However, such an exemplary embodiment is not limited thereto, and the color filter 175 may include a four-color filter which further includes a white pixel.

The planarization layer 170 is disposed on the thin film transistor 120 and the color filter 175, and includes a first protrusion 171 and a second protrusion 172. The planarization layer 170 may include an organic layer.

A contact hole through which a portion of the thin film transistor 120 is exposed may be defined through the planarization layer 170 and a passivation layer 169. For example, an end portion of the drain electrode 166, below the pixel electrode 180, may be exposed through the contact hole.

In an exemplary embodiment, the first protrusion 171 may be disposed on the gate line 122. In an alternative exemplary embodiment, the first protrusion 171 may be disposed on the data line 162 rather than on the gate line 122. However, the position of the first protrusion 171 is not limited thereto, and the first protrusion 171 may be disposed at any position in an area in which the light blocking portion 190 is to be disposed.

In an exemplary embodiment, the first protrusion 171 protrudes toward the second panel 200 to have a predetermined height, and may be formed using the same material and the same process as the planarization layer 170. In such an exemplary embodiment, the first protrusion 171 protrudes from the planarization layer 170.

As illustrated in FIG. 3, in an exemplary embodiment, each of a lower surface and an upper surface of the first protrusion 171 may have a circular shape in a plan view. In an alternative exemplary embodiment, each of a lower surface and an upper surface of the first protrusion 171 may have a polygonal shape in a plan view.

In an exemplary embodiment, the second protrusion 172 may be disposed on the gate line 122. In an alternative exemplary embodiment, the second protrusion 172 may be disposed on the data line 162 rather than on the gate line 122. However, the position of the second protrusion 172 is not limited thereto, and the second protrusion 172 may be disposed at any position in an area in which the light blocking portion 190 is to be disposed.

In an exemplary embodiment, the second protrusion 172 protrudes toward the second panel 200 to have a predetermined height, and may be formed using the same material and the same process as the planarization layer 170. In such an exemplary embodiment, the second protrusion 172 protrudes from the planarization layer 170.

As illustrated in FIG. 3, in an exemplary embodiment, each of a lower surface and an upper surface of the second protrusion 172 may have a circular shape in a plan view. In an alternative exemplary embodiment, each of a lower surface and an upper surface of the second protrusion 172 may have a polygonal shape in a plan view.

In an exemplary embodiment, a height of the second protrusion 172 is less than a height of the first protrusion 171 measured from the upper surface of the planarization layer 170. In such an exemplary embodiment in which the height of the second protrusion 172 is less than the height of the first protrusion 171, an overall combined height $h_2$ of the second protrusion 172 and a second light blocking pattern 192 on the second protrusion 172 may be less than an overall combined height hi of the first protrusion 171 and the first light blocking pattern 191 on the first protrusion 171.

The pixel electrode 180 is disposed on the planarization layer 170 to be electrically connected to the drain electrode 166 through the contact hole. The pixel electrode 180 may include a transparent conductor.

The light blocking portion 190 is disposed on the planarization layer 170 and the pixel electrode 180, and includes the first light blocking pattern 191 and the second light blocking pattern 192.

In an exemplary embodiment, the light blocking portion 190 may effectively prevent light from being emitted from an area other than a pixel area. In such an exemplary embodiment, an aperture is defined in the light blocking portion 190 corresponding to the pixel area, such that light leakage in an area other than the pixel area may be reduced or effectively prevented.

In an exemplary embodiment, the first light blocking pattern 191 is disposed on the first protrusion 171 of the planarization layer 170, and protrudes from the light blocking portion 190. In such an exemplary embodiment, the first light blocking pattern 191 and the first protrusion 171 may directly contact one another.

Referring to FIG. 3, in an exemplary embodiment, the first light blocking pattern 191 may have a trapezoidal cross section taken along a thickness direction thereof. In an alternative exemplary embodiment, the first light blocking pattern 191 may have a polygonal cross section taken along a thickness direction thereof.

In an exemplary embodiment, the first light blocking pattern 191 contacts the second panel 200. In such an exemplary embodiment, an upper end of the first light blocking pattern 191 and the second panel 200 contact one another, such that the first light blocking pattern 191 may maintain a substantially uniform cell gap between the first substrate 110 and the second substrate 210.

In an exemplary embodiment, the second light blocking pattern 192 is disposed on the second protrusion 172 of the planarization layer 170, and protrudes from the light blocking portion 190. In such an exemplary embodiment, the second light blocking pattern 192 may directly contact the second protrusion 172.

In an exemplary embodiment, the second light blocking pattern 192 and the first light blocking pattern 191 may have substantially the same thickness. In such an exemplary embodiment in which the second light blocking pattern 192 and the first light blocking pattern 191 have substantially the same thickness, the second light blocking pattern 192 and the first light blocking pattern 191 may be provided by a photolithography process, using the same mask.

However, the thickness of the second light blocking pattern 192 is not limited thereto. In an alternative exemplary embodiment, the thickness of the second light blocking pattern 192 may be less than that of the first light blocking pattern 191. In such an exemplary embodiment, the second light blocking pattern 192 and the light blocking portion 190 may be provided by a photolithography process, using the same mask.

In an exemplary embodiment, the overall combined height $h_2$ of the second protrusion 172 and the second light blocking pattern 192 on the second protrusion is less than the overall combined height $h_1$ of the first protrusion 171 and the first light blocking pattern 191 on the first protrusion 171. Accordingly, the second light blocking pattern 192 may not contact the second panel 200.

In such an exemplary embodiment, the second protrusion 172 and the second light blocking pattern 192 may together serve as a sub-column spacer which supports the function of a main column spacer.

Hereinafter, a method of manufacturing the display device 10 according to an exemplary embodiment will be described with reference to FIGS. 4A, 4B, 4C, 4D, 4E, 4F, 4G, and 4H. FIGS. 4A, 4B, 4C, 4D, 4E, 4F, 4G, and 4H are views illustrating an exemplary embodiment of the method of manufacturing the display device 10.

Figure 4A:
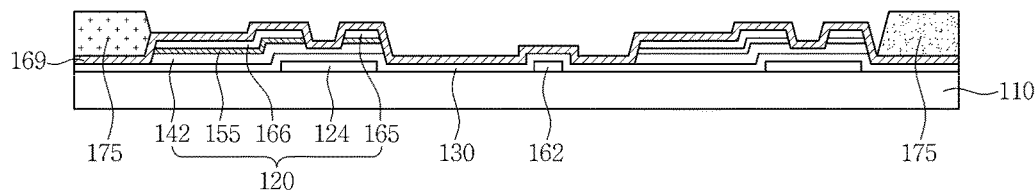
FIGS. 4A, 4B, 4C, 4D, 4E, 4F, 4G, and 4H are views illustrating an exemplary embodiment of a method of manufacturing a display device.

Referring to FIG. 4A, in an exemplary embodiment, the thin film transistor 120 and the color filter 175 are disposed on the first substrate 110 including a transparent material, e.g., glass or plastic.

In such an exemplary embodiment, the gate wirings 122 and 124 are disposed on the first substrate 110. The gate wirings 122 and 124 include the gate line 122 and the gate electrode 124.

The gate insulting layer 130 including SiNx or SiOx is disposed on the gate line 122 and the gate electrode 124.

The semiconductor layer 142 is disposed on the gate insulating layer 130.

The data line 162, the source electrode 165, and the drain electrode 166 are disposed on the semiconductor layer 142 and the gate insulating layer 130. The data line 162 intersects the gate line 122. The source electrode 165 branches out from the data line 162 to extend onto the semiconductor layer 142. The drain electrode 166 is disposed on the semiconductor layer 142 and is spaced apart from the source electrode 165.

The gate electrode 124, the semiconductor layer 142, the source electrode 165, and the drain electrode 166 collectively define the thin film transistor 120.

The passivation layer 169 is disposed on the semiconductor layer 142, the source electrode 165, and the drain electrode 166.

The color filter 175 is disposed on the passivation layer 169.

In an exemplary embodiment, for example, the color filter 175 includes red, green, and blue color filters. Adjacent edges of adjacent ones of the color filters 175 overlap one another.

Figure 4B:
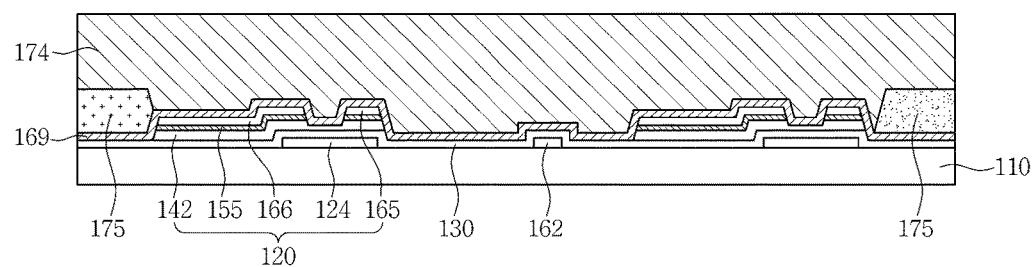

Referring to FIG. 4B, a first photosensitive composition 174 for providing the planarization layer 170 is disposed on the first substrate 110 on which the thin film transistor 120 and the color filter 175 are disposed. The first photosensitive composition 174, above the color filter 175, may have a planarized surface.

In an exemplary embodiment, the first photosensitive composition 174 may include a negative photosensitive resin composition of which an exposed portion remains and a non-exposed portion is developed. However, the type or kind of the first photosensitive composition 174 is not limited thereto, and may include a positive photosensitive resin composition, of which the solubility with respect to a developer is increased by light irradiation.

In an exemplary embodiment, the first photosensitive composition 174 may include a binder resin, a polymerizable monomer, a polymerizable oligomer, a dispersant, and/or a photo-initiator, for example.

Figure 4C:
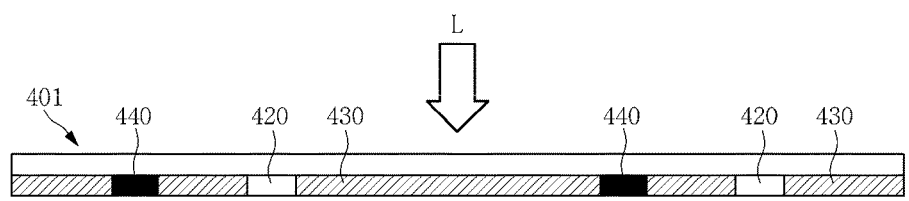
Figure 4C:
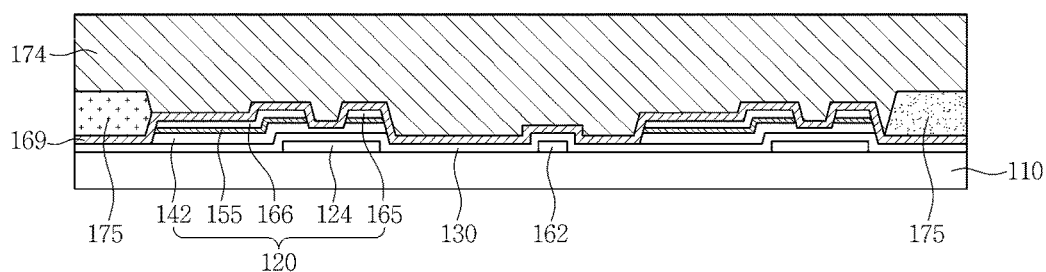

Referring to FIG. 4C, a first exposure mask 401 is disposed over and spaced apart from the first photosensitive composition 174. Light is irradiated to the first photosensitive composition 174 through the first exposure mask 401, thereby performing exposure on the first photosensitive composition 174.

In an exemplary embodiment, the first exposure mask 401 includes a light-transmissive pattern 420, a semi-transmissive pattern 430, and a light blocking pattern 440 disposed on a transparent mask substrate. In such an exemplary embodiment, the first exposure mask 401 is a three-tone mask.

In an exemplary embodiment, the light blocking pattern 440 of the first exposure mask 401 corresponds to an area for defining the contact hole. The light-transmissive pattern 420 corresponds to an area for providing the first protrusion 171 and an area for providing the second protrusion 172 of the planarization layer 170. The semi-transmissive pattern 430 corresponds to an area other than the area for defining the contact hole and the areas for providing the first protrusion 171 and the second protrusion 172. In such an exemplary embodiment, the first protrusion 171 and the second protrusion 172 may have substantially the same height.

In an exemplary embodiment, the light-transmissive pattern 420 of the first exposure mask 401 may have a transmittance of about 95% or greater, the light blocking pattern 440 may have a transmittance of about 5% or less, and the semi-transmissive pattern 430 may have a transmittance in a range of about 50% to about 60%. The transmittance of each of the light-transmissive pattern 420, the light blocking pattern 440, and the semi-transmissive pattern 430 may vary based on the type or kind of the first photosensitive composition 174.

Based on the type or kind of the first photosensitive composition 174, in an alternative exemplary embodiment, the light-transmissive pattern 420 may have a transmittance in a range of about 90% to about 100%, the light blocking pattern 440 may have a transmittance in a range of about 0% to about 1%, and the semi-transmissive pattern 430 may have a transmittance in a range of about 30% to about 40%. In another alternative exemplary embodiment, the semi-transmissive pattern 430 may have a transmittance in a range of about 60% to about 70%.

In an exemplary embodiment, the semi-transmissive pattern 430 and the light blocking pattern 440 may be provided by selectively disposing a light blocking material on the mask substrate. In such an exemplary embodiment, the transmittance of the semi-transmissive pattern 430 may be adjusted by adjusting the concentration of the light blocking material.

In an exemplary embodiment, the semi-transmissive pattern 430 may have a structure in which a light-transmissive area and a light blocking material (not illustrated) are alternately disposed. In such an exemplary embodiment, the transmittance of the semi-transmissive pattern 430 may be adjusted by adjusting a width of each of the light-transmissive area and the light blocking material.

However, the pattern of the first exposure mask 401 is not limited thereto. In an alternative exemplary embodiment, a four-tone mask which includes a first semi-transmissive pattern (not illustrated) and a second semi-transmissive pattern (not illustrated) having different transmittance from one another may be used. In such an exemplary embodiment in which the four-tone mask is used, the first semi-transmissive pattern may have a transmittance in a range of about 60% to about 70%, and may correspond to the area for providing the first protrusion 171. In addition, the second semi-transmissive pattern may have a transmittance in a range of about 30% to about 40%, and may correspond to the area for providing the second protrusion 172.

In such an exemplary embodiment, the height of the second protrusion 172 may be less than that of the first protrusion 171.

Figure 4D:
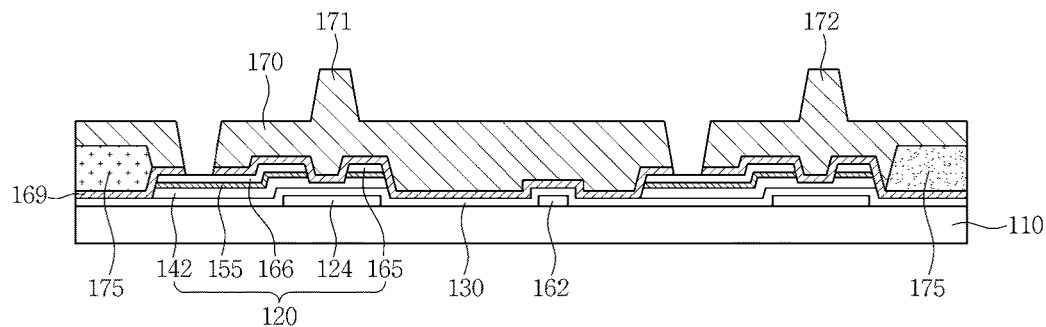

Referring to FIG. 4D, in an exemplary embodiment, the exposed first photosensitive composition 174 is developed by a developer and is cured, thereby providing the planarization layer 170.

In such an exemplary embodiment, portions of the first photosensitive composition 174 and the passivation layer 169 that are disposed below the light blocking pattern 440 of the first exposure mask 401 are removed, thereby defining the contact hole through which a portion of the drain electrode 166 is exposed. In such an exemplary embodiment, a portion of the first photosensitive composition 174 that is disposed below the light-transmissive pattern 420 of the first exposure mask 401 remains, and a portion of the first photosensitive composition 174 that is disposed below the semi-transmissive pattern 430 is partially removed, thereby providing the planarization layer 170 including the first protrusion 171 and the second protrusion 172 having the same height.

The planarization layer 170 of FIG. 4D provided in the above-described manner is an organic layer.

Figure 4E:
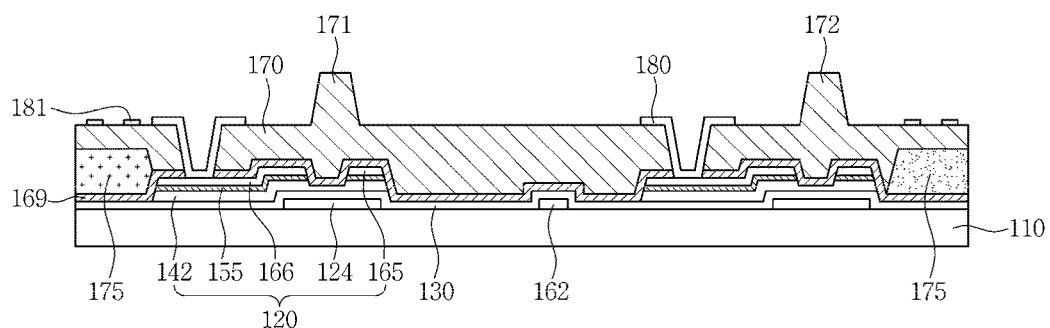

Referring to FIG. 4E, the pixel electrode 180 is disposed on the planarization layer 170 to be electrically connected to the drain electrode 166 through the contact hole.

Figure 4F:
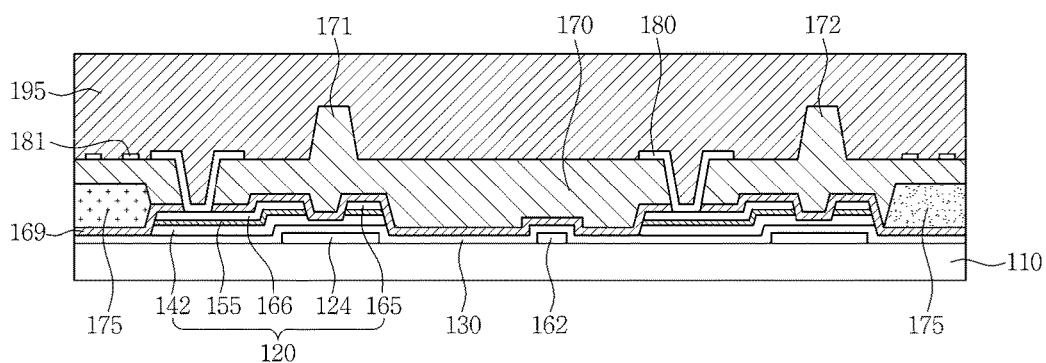

Referring to FIG. 4F, a second photosensitive composition 195 for providing the light blocking portion 190 is disposed on the planarization layer 170 and the pixel electrode 180.

The second photosensitive composition 195 includes a negative photosensitive resin composition. The second photosensitive composition 195 may include a binder resin, a polymerizable monomer, a polymerizable oligomer, a pigment, a dispersant, and/or a photo-initiator. Examples of the pigment may include a black pigment, a black resin, or the like.

Figure 4G:
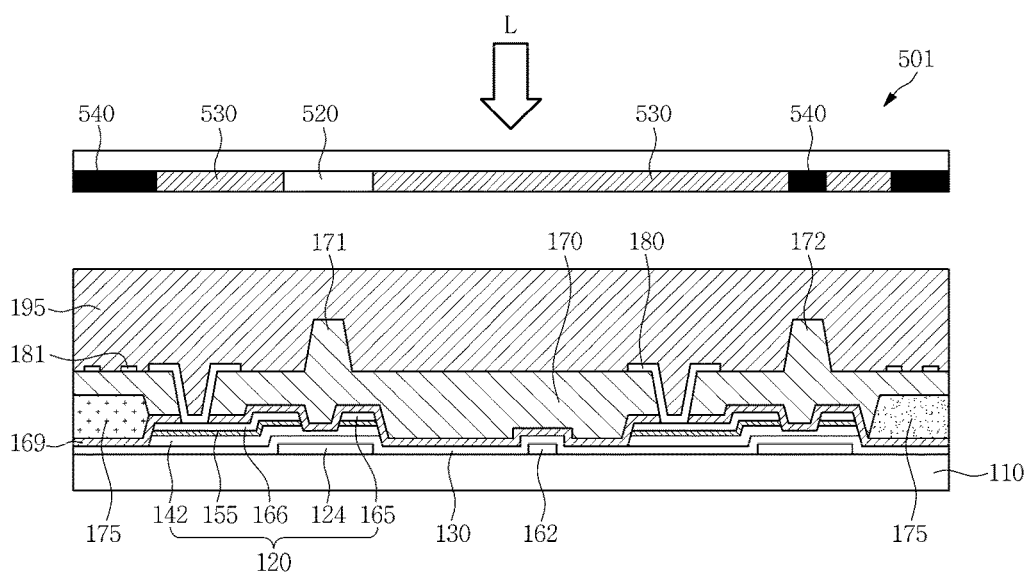

Referring to FIG. 4G, a second exposure mask 501 is disposed over and spaced apart from the second photosensitive composition 195. Light is irradiated to the second photosensitive composition 195, thereby performing exposure on the second photosensitive composition 195.

In an exemplary embodiment, the second exposure mask 501 includes a light-transmissive pattern 520, a semi-transmissive pattern 530, and a light blocking pattern 540 disposed on a transparent mask substrate. In such an exemplary embodiment, the second exposure mask 501 is a three-tone mask including three areas having different transmittance from one another.

The light-transmissive pattern 520 of the second exposure mask 501 corresponds to an area for providing the first light blocking pattern 191. The light blocking pattern 540 corresponds to an area at which the second protrusion 172 is disposed and an area at which the pixel electrode 180 is disposed. The semi-transmissive pattern 530 corresponds to an area for providing the light blocking portion 190, which is an area other than the area for providing the first light blocking pattern 191, the area at which the second protrusion 172 is disposed and the area at which the pixel electrode 180 is disposed.

In an exemplary embodiment, the light-transmissive pattern 520 of the second exposure mask 501 may have a transmittance of about 95% or greater, the light blocking pattern 540 may have a transmittance of about 5% or less, and the semi-transmissive pattern 530 may have a transmittance in a range of about 50% to about 60%. The transmittance of each of the light-transmissive pattern 520, the light blocking pattern 540, and the semi-transmissive pattern 530 may vary based on the type or kind of the second photosensitive composition 195 or the thickness of the light blocking portion 190.

Based on the type or kind of the second photosensitive composition 195, in an alternative exemplary embodiment, the light-transmissive pattern 520 may have a transmittance in a range of about 90% to about 100%, the light blocking pattern 540 may have a transmittance in a range of about 0% to about 1%, and the semi-transmissive pattern 530 may have a transmittance in a range of about 30% to about 40%. In another alternative exemplary embodiment, the semi-transmissive pattern 530 may have a transmittance in a range of about 60% to about 70%.

In another alternative exemplary embodiment, the light-transmissive pattern 520 of the second exposure mask 501 may correspond to the area at which the second protrusion 172 is disposed. In such an exemplary embodiment, a second light blocking pattern 192 having substantially the same thickness as that of the first light blocking pattern 191 may be disposed on the second protrusion 172.

In still another alternative exemplary embodiment, the semi-transmissive pattern 530 of the second exposure mask 501 may correspond to the area at which the second protrusion 172 is disposed. In such an exemplary embodiment, a second light blocking pattern 192 having a less thickness than that of the first light blocking pattern 191 may be disposed on the second protrusion 172 as disclosed in FIG. 3.

In an exemplary embodiment, the semi-transmissive pattern 530 and the light blocking pattern 540 may be provided by selectively disposing a light blocking material on the mask substrate. In such an exemplary embodiment, the transmittance of the semi-transmissive pattern 530 may be adjusted by adjusting the concentration of the light blocking material.

In an exemplary embodiment, the semi-transmissive pattern 530 may have a structure in which a light-transmissive area and a light blocking material (not illustrated) are alternately disposed. In such an exemplary embodiment, the transmittance of the semi-transmissive pattern 530 may be adjusted by adjusting a width of each of the light-transmissive area and the light blocking material.

Figure 4H:
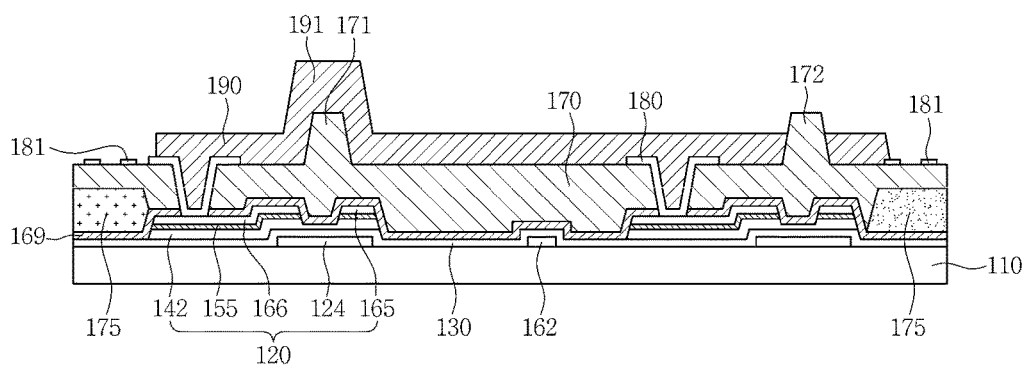

Referring to FIG. 4H, the exposed second photosensitive composition 195 is developed using a developer and is cured, thereby providing the light blocking portion 190 and the first light blocking pattern 191.

Subsequently, the second panel 200 is disposed on the first light blocking pattern 191 and the second protrusion 172 to be opposite to the first panel 100, and the liquid crystal layer 300 is disposed between the first panel 100 and the second panel 200.

In such an exemplary embodiment, the common electrode 220 is disposed on the second substrate 210, the liquid crystal layer 300 is disposed on the first panel 100, and the first panel 100 and the second panel 200 are bonded to one another, such that the LCD device 10 illustrated in FIGS. 1 and 2 is provided.

As set forth above, in the display device according to one or more exemplary embodiments, the light blocking portion may be manufactured using a three-tone mask rather than a four-tone mask, and thus the manufacturing costs of the display device may be reduced.

From the foregoing, it will be appreciated that various embodiments in accordance with the disclosure have been described herein for purposes of illustration, and that various modifications may be made without departing from the scope and spirit present teachings. Accordingly, the various embodiments disclosed herein are not intended to limit the true scope and spirit of the present teachings. Various features of the above described and other embodiments can be mixed and matched in any manner, to produce further embodiments consistent with the present inventive concept.

What is claimed is:

1. A method of manufacturing a display device, the method comprising:
   providing a first substrate;
   disposing thin film transistors and color filters on the first substrate;
   disposing a planarization layer on the thin film transistors and the color filters, the planarization layer comprising a first protrusion and a second protrusion;
   disposing a light blocking portion on the planarization layer to define a pixel area;
   disposing a liquid crystal layer on the first substrate; and
   disposing a second substrate opposite to and spaced apart from the first substrate,
   wherein the light blocking portion comprises a first light blocking pattern disposed on the first protrusion, and the first light blocking pattern contacts the second substrate, and
   wherein the second protrusion contacts with the liquid crystal layer.

2. The method of claim 1, wherein the first protrusion and the second protrusion of the planarization layer have a same height as one another measured from the planarization layer.

3. The method of claim 1, wherein the disposing of the planarization layer comprises:
   disposing a first photosensitive composition on the thin film transistors;
   disposing a first exposure mask over the first photosensitive composition, and performing exposure by irradiating light to the first photosensitive composition; and
   developing and curing the exposed first photosensitive composition to form the planarization layer.

4. The method of claim 3, wherein the first exposure mask comprises a light-transmissive pattern, a semi-transmissive pattern, and a light blocking pattern.

5. The method of claim 4, wherein the planarization layer is formed of a negative photosensitive composition, and
   wherein the light-transmissive pattern corresponds to a region for the first protrusion and the second protrusion, and the light blocking pattern corresponds to a region for a contact hole.

6. The method of claim 1, wherein the disposing of the light blocking portion comprises:
   disposing a second photosensitive composition on the planarization layer;
   disposing a second exposure mask over the second photosensitive composition, and performing exposure by irradiating light to the second photosensitive composition; and
   developing and curing the exposed second photosensitive composition to form the light blocking portion.

7. The method of claim 6, wherein the second exposure mask comprises a light-transmissive pattern, a semi-transmissive pattern, and a light blocking pattern.

8. The method of claim 7, wherein the light blocking pattern of the second exposure mask corresponds to a region for the second protrusion.

* * * * *